United States Patent
Burgess

(10) Patent No.: US 7,642,791 B2
(45) Date of Patent: Jan. 5, 2010

(54) ELECTRONIC COMPONENT/INTERFACE INTERPOSER

(75) Inventor: Jeff Burgess, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/703,747

(22) Filed: Nov. 7, 2003

(65) Prior Publication Data

US 2005/0099193 A1 May 12, 2005

(51) Int. Cl.
G01R 31/02 (2006.01)
(52) U.S. Cl. ...................................... 324/754
(58) Field of Classification Search ................ 324/754, 324/755–757, 761–762, 765, 158.1; 439/482, 439/69–72; 361/400, 704, 706
See application file for complete search history.

(56) References Cited

U.S. PATENT DOCUMENTS

| | | | |
|---|---|---|---|
| 4,415,403 A | 11/1983 | Bakewell | |
| 5,228,189 A | 7/1993 | Driller et al. | |
| 5,896,037 A * | 4/1999 | Kudla et al. | 324/755 |
| 5,903,162 A * | 5/1999 | Cole et al. | 324/754 |
| 5,982,186 A | 11/1999 | Buschbom | |
| 6,024,579 A | 2/2000 | Bennett | |
| 6,027,346 A | 2/2000 | Sinsheimer et al. | |
| 6,062,873 A | 5/2000 | Kato | |
| 6,069,482 A * | 5/2000 | Hilton | 324/755 |
| 6,137,297 A * | 10/2000 | McNair et al. | 324/754 |
| 6,211,690 B1 * | 4/2001 | Fjelstad | 324/761 |
| 6,215,321 B1 * | 4/2001 | Nakata | 324/754 |
| 6,354,844 B1 | 3/2002 | Coico et al. | |
| 6,414,248 B1 | 7/2002 | Sundstrom | |
| 6,489,790 B1 * | 12/2002 | An et al. | 324/755 |
| 6,524,115 B1 | 2/2003 | Gates et al. | |
| 6,707,312 B2 * | 3/2004 | Stave | 324/765 |
| 6,756,797 B2 | 6/2004 | Brandorff et al. | |
| 6,777,965 B1 * | 8/2004 | Mess | 324/755 |
| 6,798,224 B1 | 9/2004 | Hembree et al. | |
| 6,830,460 B1 | 12/2004 | Rathburn | |
| 6,861,857 B2 * | 3/2005 | Moushon | 324/755 |
| 6,864,700 B2 * | 3/2005 | Mess | 324/765 |
| 6,879,169 B2 | 4/2005 | Ohtaki | |
| 6,940,093 B2 | 9/2005 | Eldridge et al. | |
| 7,009,412 B2 | 3/2006 | Chong et al. | |

(Continued)

FOREIGN PATENT DOCUMENTS

JP 2001-116795 4/2001

OTHER PUBLICATIONS

PCT/US/2004/035924 Notification of Transmittal of the International Search Report and the Written Opinion of the International Searching Authority, or the Declaration.

(Continued)

*Primary Examiner*—Ha Tran Nguyen
*Assistant Examiner*—Tung X. Nguyen
(74) *Attorney, Agent, or Firm*—Blakely, Sokoloff, Taylor & Zafman LLP

(57) ABSTRACT

In one embodiment, an interposer is made of a flexible, non-electrically conductive material with electrically conductive paths formed therein to substantially correspond with a pattern of electrical contacts of an electronic component and with a pattern of electrical contacts of an interface to be coupled to the electronic component.

22 Claims, 5 Drawing Sheets

U.S. PATENT DOCUMENTS

| | | |
|---|---|---|
| 7,048,548 B2 | 5/2006 | Mathieu et al. |
| 2001/0040464 A1 | 11/2001 | Tanioka et al. |
| 2004/0046581 A1 | 3/2004 | Maekawa et al. |
| 2004/0142583 A1 | 7/2004 | Mathieu et al. |

OTHER PUBLICATIONS www.minco. com Minco, "Flex-Circuit Design Guide" Applciation Aid #24, Nov. 2002, pp. 28.

www.lenthor.com/faqs.html "Lenthor Engineering- Flex FAQs" Dec. 14, 2003, pp. 11.

Intel Corporation, Written Opinion dated Jul. 14, 2008 for Singapore Patent Application No. 200602371-7.

Intel Corporation, Office Action dated Jun. 4, 2008 for Chinese Patent Application No. 200480040021.0.

* cited by examiner

ELECTRONIC COMPONENT/INTERFACE INTERPOSER

FIELD

The embodiments disclosed herein relate generally to testing electronic components.

BACKGROUND

In order to ensure a desired quality level of mass-produced electronic components, at least some of the electronic components need to be tested (e.g., a certain number per batch). In some cases, each component needs to be tested. Various testing methodologies can be used to test, for example, electrical connectivity, functionality, and efficiency at different operating speeds and/or temperatures.

If the component to be tested is a circuit board with various interfaces for different types of components, the system can be tested by inserting the appropriate type of components into each of the respective interfaces so that the circuit board/component combination can be tested together. A packaged integrated circuit (e.g., a processor) is one type of component that might be used to test a circuit board in this manner.

For example, if a processor were used to test a circuit board, the processor would be inserted into the proper interface on the circuit board. Once the testing for that circuit board is completed, the processor is removed from the circuit board and placed in the next circuit board to be tested. This can become problematic since the processor may have pins that are inserted into sockets in the interface of the circuit board.

The pins of the processor may be relatively soft, being formed of nickel and/or copper and plated with gold. After repeated use (e.g., between 25 and 500 insertions), it is not unusual for one or more of the pins of the processor to break or bend, resulting in a processor that is no longer useable for testing circuit boards.

To combat this, interposers (e.g., pin savers, socket savers) have been employed to prolong the useful life of the processor. An interposer is generally a piece of rigid material formed to receive a processor, including recesses to receive the pins of the processor. The interposer material (e.g., fiberglass) protects the pins from damage but still allows the testing to be effectively conducted. With an interposer, a processor may be used for up to 3000 tests before being replaced with a new processor for testing the circuit board.

If a card (e.g., a graphics card) is used to test a circuit board, the card will typically require a different type of interposer. For example, most cards have an edge with several elongate areas of electrical contact ("fingers") by which the card can be electrically coupled to a card interface on the circuit board. An interposer for a card would generally be formed of a rigid material that can slide over the card edge and can establish electrical contact between the card and the interface.

Although different types of interposers can be used to prolong the usefulness of a component to test a device such as a circuit board, conventional interposers will not work with every type of component/interface combination.

DESCRIPTION OF THE DRAWINGS

Various embodiments are illustrated by way of example and not by way of limitation in the figures of the accompanying drawings in which like references indicate similar elements. It should be noted that references to "an," "one," "the," "other," "another," "alternative," or "various" embodiments in this disclosure are not necessarily to the same embodiment, and such references mean at least one.

DETAILED DESCRIPTION

The following description and the accompanying drawings provide examples for the purposes of illustration. However, these examples should not be construed in a limiting sense as they are not intended to provide an exhaustive list of all possible implementations.

Figure 1:
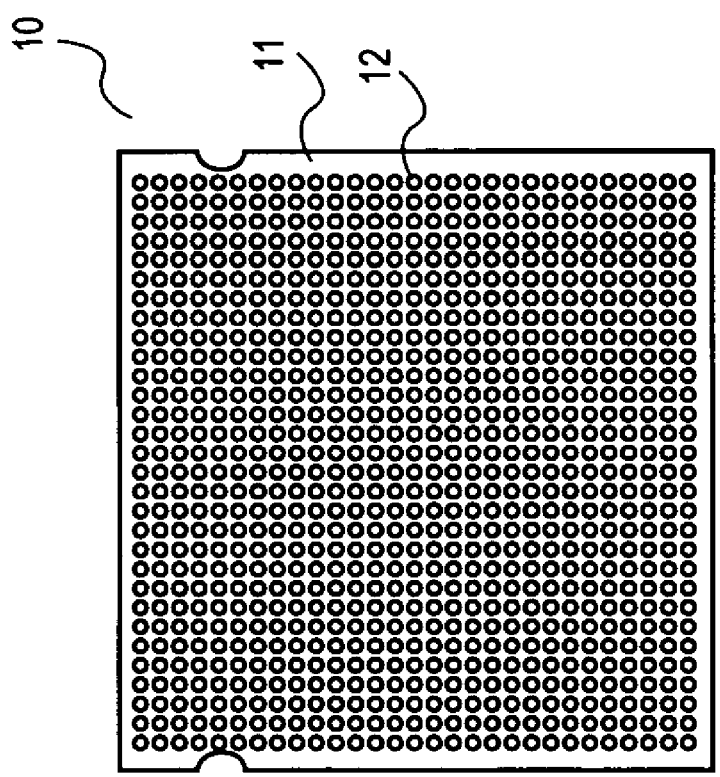
FIG. 1 shows one embodiment of an interposer for a packaged integrated circuit.

Referring now to FIG. 1, one embodiment is shown in which interposer 10 is generally flat and is made of a layer of flexible, non-electrically conductive material. Among other advantages, the flexibility of the material increases the durability of interposer 10. In the embodiment shown, interposer 10 is made of a flexible polyimide film sold by E.I. du Pont de Nemours and Co. under the registered trademark KAPTON.

However, interposer 10 may be made of any suitable material or combination of materials. For example, interposer 10 may be made of fiberglass and/or any material suitable for printed circuit boards. Suitable printed circuit board material may include, for example, epoxies, polyimides, polyphenylene oxide, bismaleimide/triazine, and hydrocarbon/ceramic thermostat laminates.

Regardless of the materials used for interposer 10, the interposer may, in various embodiments, have approximately the same size and overall shape as is necessary to serve as a suitable interposer between an electronic component and an interface to which the electronic component is to be attached. In addition, interposer 10 may include one or more recesses or cutouts to accommodate the structure of and/or components on the electronic component.

FIG. 1 shows that interposer 10 includes side 11 with a plurality of vias 12 that each have one end exposed on side 11. The other side of interposer 10 (not shown) is a mirror image of side 11, with the same number and pattern of vias 12 as side 11. In various embodiments, vias 12 can be microvias, which are blind or buried vias with diameters smaller than 100 microns. In other embodiments, any electrically conductive path can be used.

In operation, the electrically conductive paths can be used to electrically couple the electrical contacts of an electronic component (e.g., a packaged integrated circuit, such as a processor, or a card) to the electrical contacts of an interface (e.g., that may be coupled to a circuit board). In the embodiment shown in FIG. 1, vias 12 are disposed straight through interposer 10 to create a one-to-one correlation between the electrical contacts of an electronic component and the electrical contacts of an interface to which the electronic component is to be attached.

However, in other embodiments, the internal structure of vias 12 may be changed in any suitable manner so long as the electrical contacts of the electronic component and the electrical contacts of the interface are electrically coupled in a desired manner. Also, in another embodiment, the diameter of the vias on one side of interposer 10 can vary relative to the diameter of the vias on the other side of interposer 10. Different diameters can, among other advantages, improve the electrical contact between the electrical component to the interface. In such an embodiment wherein the diameter of the vias changes from one side of the interposer to the other, the diameter of the via may change gradually (e.g., taper) or in a stepped fashion through the thickness of the interposer.

Figure 2:
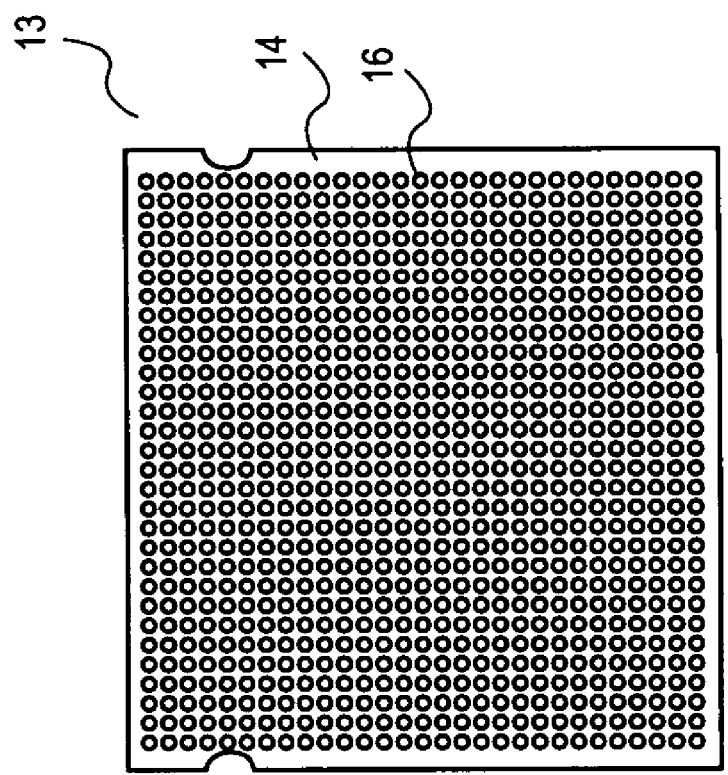
FIG. 2 shows an example of a packaged integrated circuit that could be used with the interposer of FIG. 1.

FIG. 2 shows processor 13, which is generally flat and has electrical contacts 16 exposed on side 14 of processor 13. The side of processor 13 opposite side 14 may include a protrusion, as discussed more fully below. The pattern of electrical contacts 16 of processor 13 is substantially the same as the pattern of vias 12 of interposer 10 of FIG. 1. Thus, interposer 10 can be used in conjunction with processor 13.

Figure 3:
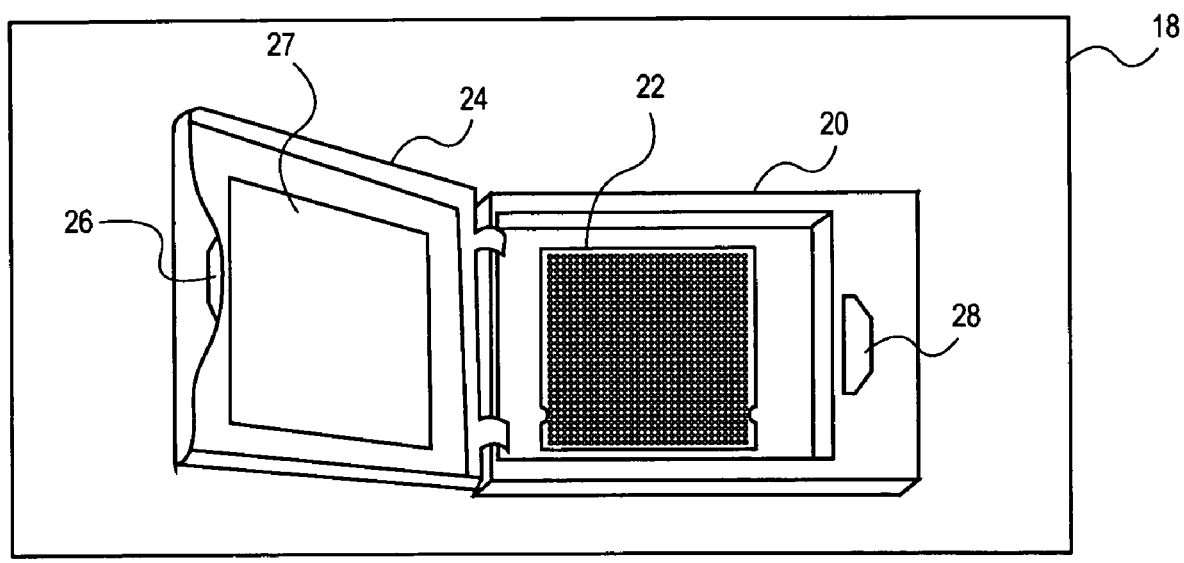
FIG. 3 shows a circuit board with an interface that could be used with the packaged integrated circuit of FIG. 2 and the interposer of FIG. 1.

FIG. 3 shows interface 20 attached to circuit board 18. Interface 20 includes electrical contacts 22 arranged in the same pattern as that of vias 12 of interposer 10 of FIG. 1. Thus, interposer 10 can be used in conjunction with processor 13 of FIG. 2 and interface 20 of FIG. 3.

Interface 20 additionally includes a unique structural distinction over conventional interfaces. For example, electrical contacts 22 each comprise a contact pad mechanically biased toward an electronic component when the electronic component and the interface are mechanically coupled. In addition, interface 20 may include a mechanism to secure an electronic component to interface 20 with sufficient force on the electronic component to ensure electrical contact between the electronic component and interface 20. Lid 24 (shown in an open position in FIG. 3) may be used to impart sufficient force on an electronic component (e.g., a processor) to ensure electrical contact between the electronic component and interface 20.

Lid 24 may include tab 26 that may be inserted into slot 28 to releasably "lock" lid 24 in a closed position. Moreover, lid 24 may include opening 27 to facilitate a snug fit and/or proper alignment of lid 24 relative to a protrusion on a side of the electronic component opposite the side with electrical contacts 16.

Figure 4:
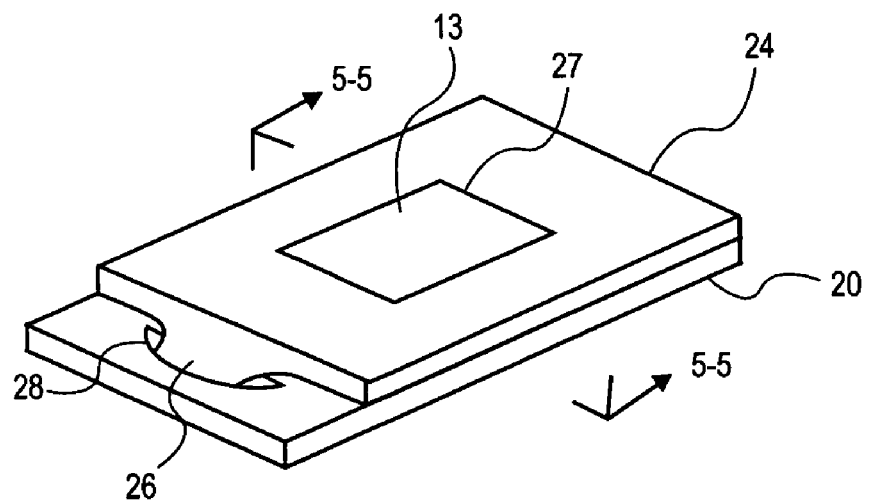
FIG. 4 shows a perspective view of the interface of FIG. 3 in a closed position with a packaged integrated circuit and an interposer disposed therein.

FIG. 4 shows a perspective view of interface 20 of FIG. 3 in a closed position with processor 13 of FIG. 2 and interposer 10 of FIG. 1 disposed therein. In the embodiment shown, the thickness of interposer 10 can be varied so long as lid 24 of interface 20 can still close. Thus, the interposer should be thick enough to be durable but not thick enough to interfere with the mechanism that ensures electrical contact between the electronic component and the interface.

Figure 5:
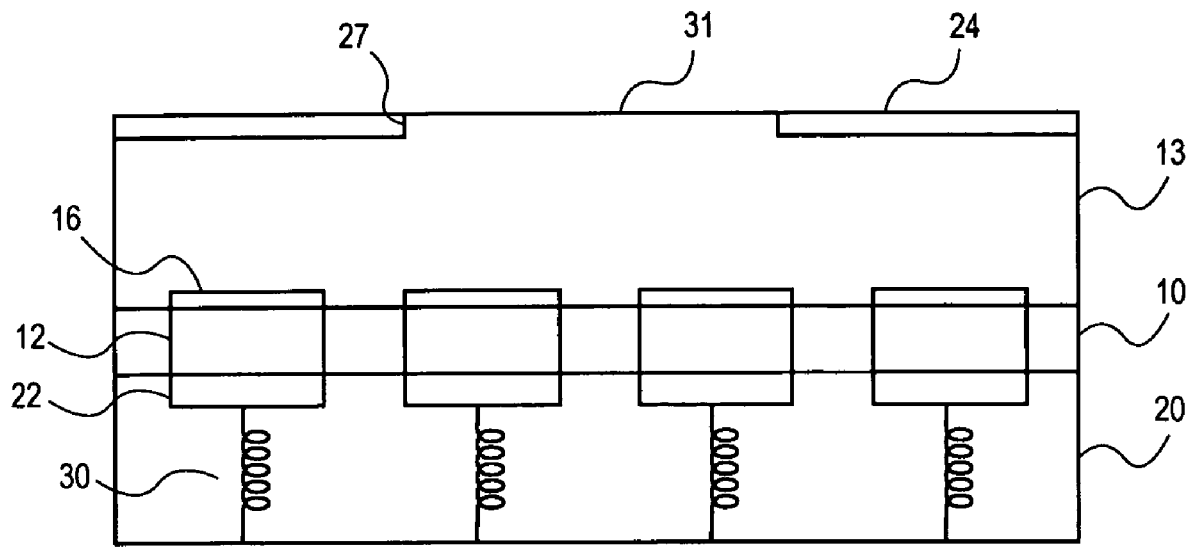
FIG. 5 is a cross-sectional view of the packaged integrated circuit/interposer/interface combination of FIG. 4 taken along plane 5-5 of FIG. 4.

FIG. 5 shows a magnified, cross-sectional view of a portion of the structure of FIG. 4 taken along plane 5-5. Interposer 10 can be seen disposed between processor 13 and interface 20. Vias 12 of interposer 10 form a one-to-one match of electrical contacts 16 of processor 13 and electrical contacts 22 of interface 20. Springs 30 can be used to mechanically bias each electrical contact 22 (e.g., contact pad) toward processor 13. Lid 24 imparts sufficient force on processor 13 to ensure electrical contact between processor 13 and interface 20 (albeit an indirect electrical connection when interposer 10 is used during, for example, a testing procedure). Processor 13 also includes protrusion 31, which engages opening 27 of lid 24 to ensure a snug fit and/or proper alignment between processor 13 and interface 20.

Although the embodiments shown only utilize mechanically-biased contact pads on the interface, other embodiments may utilize mechanically-biased contact pads on both the electronic component and the interface or on the electronic component alone.

Figure 6:
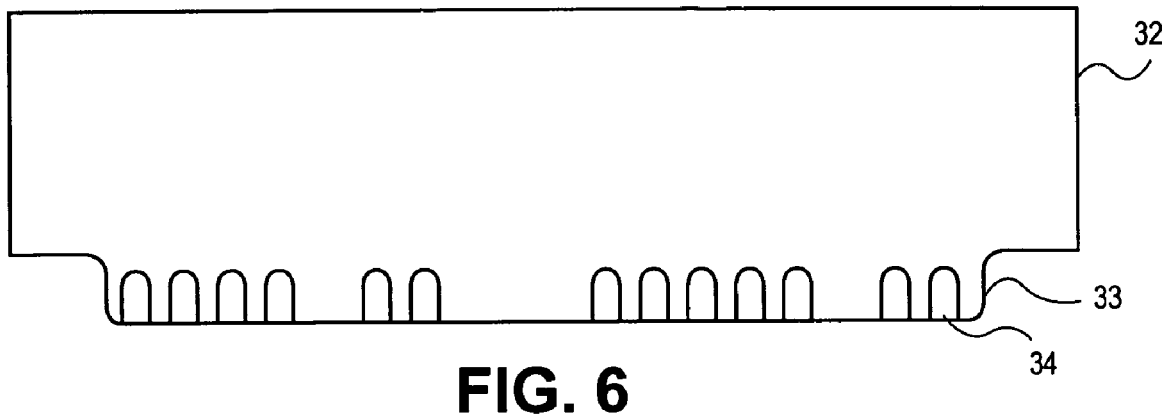
FIG. 6 shows an example of a line card that could be used to test a circuit board.

FIG. 6 shows card 32 that may be used in conjunction with an interface designed to receive a card. Card 32 includes fingers 34 that may be used to electrically couple card 32 to the electrical contacts of an interface. The interface may be attached to, for example, a circuit board.

Figure 7A:
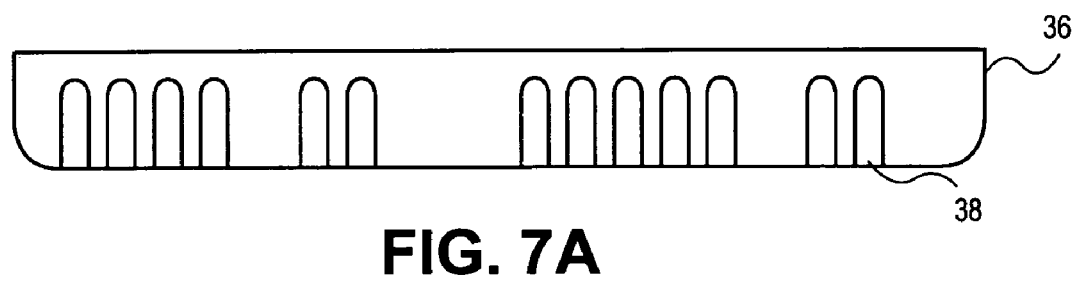
FIG. 7A shows a side view of one embodiment of an interposer that could be used with the line card of FIG. 6.
Figure 7B:
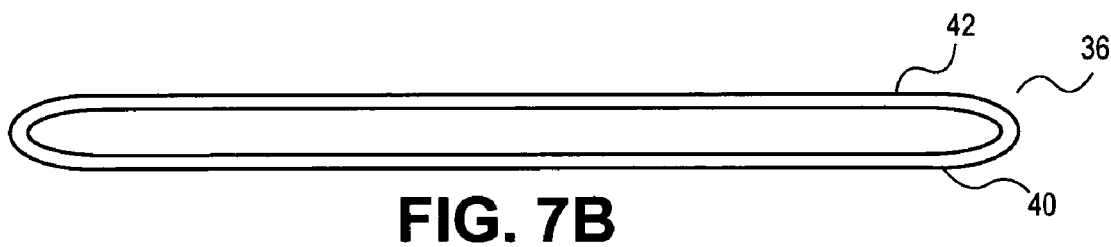
FIG. 7B shows a top view, looking into the interposer of FIG. 7A.

FIG. 7A shows one embodiment of an interposer that could be used with card 32 of FIG. 6. Interposer 36 may be made of flexible, non-electrically conductive material such as, for example, a polyimide material, fiberglass, and/or any material suitable for forming a printed circuit board. Regardless of the material used, interposer 36 may have a sleeve-like shape such that interposer 36 may slide snugly over edge 33 of card 32. This sleeve-like shape can be seen in FIG. 7B, which shows a top view of interposer 36, having first side 40 and second side 42.

Interposer 36 also includes electrically conductive paths 38 that substantially correspond to fingers 34 of card 32. The pattern of electrically conductive paths 38 of interposer 36 can be arranged to substantially correspond with fingers 34 of card 32, which may be (i) only present on one side of interposer 36, (ii) the same on both first side 40 and second side 42 of interposer 36, or (iii) different on first side 40 from the pattern on second side 42. Thus, interposer 36 can be used to electrically couple card 32 to an interface designed to receive card 32.

The thickness of interposer 36 may be varied to make interposer 36 durable but not so thick as to impede the ability to insert card 32 into an appropriate interface. Although not shown in the figures, an interface with electrical contacts that are mechanically-biased towards the card when the card is inserted into the interface may also be used.

Figure 8:
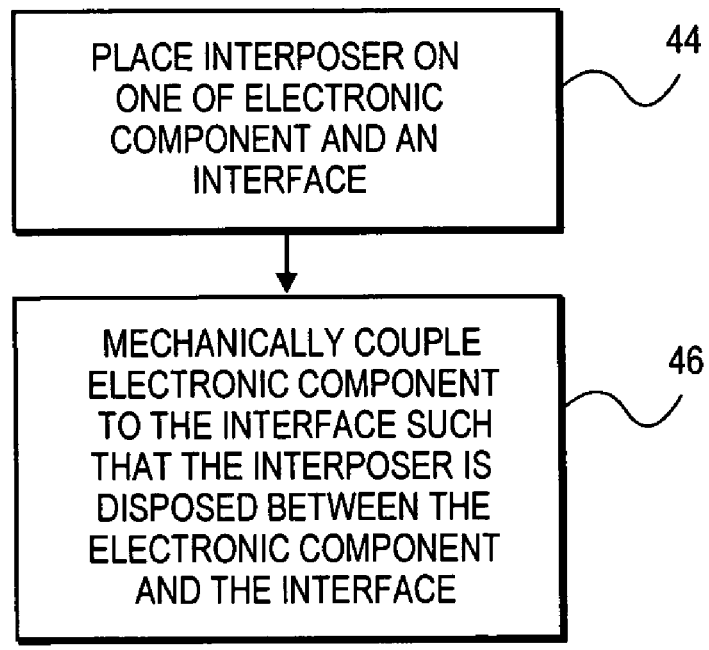
FIG. 8 is a flow chart for one embodiment of a method of using an interposer in combination with an electronic component.

FIG. 8 shows a flow chart of one embodiment of a method for using an interposer with an electronic component (e.g., a processor or a card) and an interface. At block 44, the interposer is placed on one of the electronic component and the interface to which the electronic component is to be coupled. The interposer may be made of a layer of flexible, non-electrically conductive material with electrically conductive paths formed in the layer, as described above. The electronic component is mechanically coupled to an interface, at block 46, so that the interposer is disposed between the electronic component and the interface.

In other embodiments, the method can further include testing at least one of the electronic component and a circuit board to which the interface in connected. Also, the interface may include electrical contacts that each comprise a contact pad mechanically-biased toward the electronic component when the electronic component and the interface are mechanically coupled. For example, a spring could be used to bias each contact pad in a desired direction. In an embodiment with mechanically-biased contact pads on the interface, the interface may include, or have attached thereto, a mechanism to secure the electronic component to the interface with sufficient force to ensure electrical contact between the electronic component and the interface.

Figure 9:
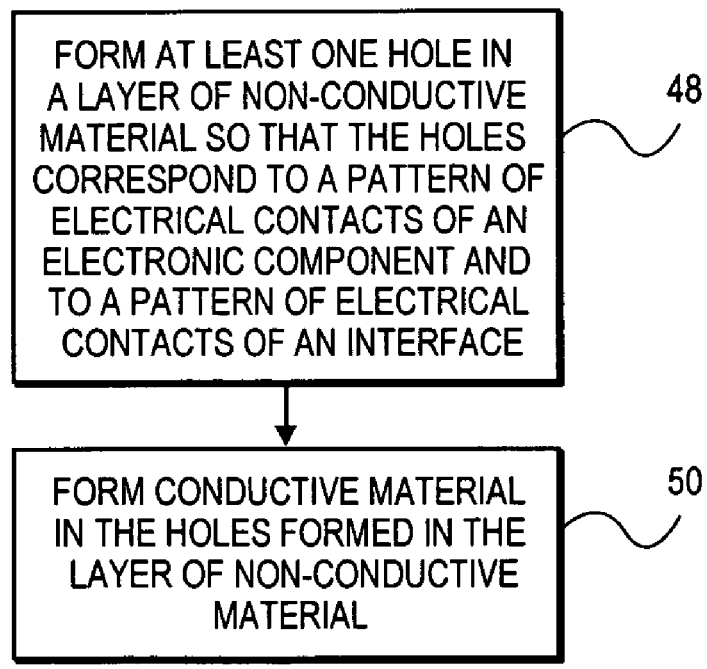
FIG. 9 is a flow chart for one embodiment of a method of creating an interposer.

FIG. 9 shows a flow chart for one embodiment of a method of creating an interposer. At block 48, at least one hole is formed in a layer of flexible, non-electrically conductive material such that the holes correspond to a pattern of electrical contacts of an electronic component and to a pattern of electrical contacts of an interface to be coupled to the electronic component. In various embodiments, the holes may be formed by at least one of chemical etching, photolithography, and laser formation. Moreover, the holes may, in one embodiment, be formed with a diameter less than approximately 100 microns. After the holes are formed, conductive material is formed in the holes, at block 50 (e.g., to create electrically conductive paths in the layer of non-conductive material).

In an alternative embodiment, the electrically conductive paths may be formed by altering the conductive properties of selected areas of the layer of non-electrically conductive material. This may be done by, for example, selectively doping the areas that are chosen to be used as electrically conductive paths.

Although the embodiments disclosed herein relate generally to electronic components that are received into a female-type interface, other embodiments may be implemented wherein the interposer is designed for use with an electronic component to receive a male-type interface.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claims.

I claim:

1. An apparatus comprising:
a body having dimensions suitable to serve as an interposer between a different electronic component and an interface, the body comprising non-electrically conductive material and having a flexible property;
a plurality of vias formed in the body; and
the interface comprising a plurality of electrical contacts, each of the plurality of electrical contacts extending completely through one of the plurality of vias and comprising a contact pad mechanically biased into a via, to contact a contact of the different electronic component when the electronic component and the interface are electrically coupled with the body therebetween,
wherein the body further comprises recesses or cutouts to accommodate components on the electronic component.

2. The apparatus of claim 1, wherein the body comprises: a polyimide film.

3. The apparatus of claim 1, wherein the body comprises: at least one of fiberglass and a material suitable for forming a printed circuit board.

4. The apparatus of claim 1, wherein the conductive path comprises:
a via.

5. The apparatus of claim 1, wherein the electronic component comprises:
at least one of a packaged integrated circuit and a card.

6. The apparatus of claim 5, wherein the at least one conductive path substantially corresponds with a first pattern of electrical contacts of the electronic component and a second pattern of electrical contacts of the interface.

7. The apparatus of claim 1, further comprising:
a mechanism to impart sufficient force on the electronic component to ensure electrical contact between the electronic component and the interface.

8. An apparatus comprising:
a body having dimensions suitable to serve as an interposer between a different electronic component and an interface, the body comprising non-electrically conductive material and having a flexible property;
a plurality of vias formed in the body; and
the interface comprising a plurality of electrical contacts, each of the plurality of electrical contacts extending completely through one of the plurality of vias and comprising a contact pad mechanically biased into the via, to contact a contact of the different electronic component when the electronic component and the interface are electrically coupled with the body therebetween, wherein the body further comprises recesses or cutouts to accommodate components on the electronic component, wherein the interface comprises springs to mechanically bias the contact pads toward the contacts of the electronic component, and wherein the apparatus comprises a lid to be releaseably locked to the interface in a closed position and to impart sufficient force on the electronic component and on the interface to form an electrical connection between the electronic component and contact pads of the interface.

9. The apparatus of claim 1, wherein the body comprises one of an epoxy, a polyphenylene oxide, a bismaleimide\triazine, and a hydrocarbon\ceramic thermostat laminate.

10. The apparatus of claim 1, wherein the body comprises a combination of materials including fiberglass and one of an epoxy, a polyphenylene oxide, bismaleimide\triazine, and a hydrocarbon\ceramic thermostat laminate.

11. The apparatus of claim 1, wherein the body comprises:
a first surface oriented towards the interface;
a second surface opposing the first surface, wherein the electrical contacts extend through the first and second surfaces.

12. An apparatus comprising:
a body having dimensions suitable to serve as an interposer between a different packaged integrated circuit and an interface, the body comprising non-electrically conductive polyimide material and having a flexible property;
a plurality of vias formed in the body; and
the interface comprising a plurality of electrical contacts, each of the plurality of electrical contacts extending completely through one of the plurality of via and comprising a contact pad mechanically biased with a spring into the via, to contact a contact of the different packaged integrated circuit when the different packaged integrated circuit and the interface are electrically coupled.

13. The apparatus of claim 12, wherein the conductive path comprises:
a via.

14. The apparatus of claim 12, wherein the packaged integrated circuit comprises:
a processor.

15. The apparatus of claim 14, wherein the at least one conductive path substantially corresponds with a first pattern of electrical contacts of the packaged integrated circuit and a second pattern of electrical contacts of the interface.

16. The apparatus of claim 12, further comprising:
a mechanism to impart sufficient force on the packaged integrated circuit to ensure electrical contact between the packaged integrated circuit and the interface.

17. A method comprising:
placing an interposer on one of an electronic component and an interface to be coupled to the electronic component, wherein the interposer comprises:
a body of non-electrically conductive material and having a flexible property, and
a plurality of vias formed in the body to electrically couple at least one electrical contact of the electronic component to at least one electrical contact of the interface; and
mechanically coupling the electronic component to the interface such that the interposer is disposed between the electronic component and the interface,
wherein the at least one electrical contact of the interface extends completely through one of the plurality of vias and comprises a contact pad that is biased with a spring into the via, to contact a contact of a different electronic component when the electronic component and the interface are mechanically coupled.

18. The method of claim 17, further comprising:
testing at least one of the electronic component and a circuit board to which the interface is coupled.

19. The method of claim 17, further comprising:
securing the electronic component to the interface with a mechanism capable of imparting sufficient force on the electronic component to ensure electrical contact between the electronic component and the interface.

20. The apparatus of claim 11, wherein the interface comprises springs anchored to the interface and attached to each electrical contact, the springs to mechanically bias the electrical contacts away from the interface so that a first portion of the electrical contacts are disposed within the interface, a second portion of the electrical contacts are disposed within the vias, and a third portion of the electrical contacts are disposed within the electronic component.

21. The apparatus of claim 1 wherein each of the plurality of electrical contacts comprises a shaft of solid material extending completely through one of the plurality of vias.

22. The apparatus of claim 12 wherein each of the plurality of electrical contacts comprises a shaft of solid material extending completely through one of the plurality of vias.

* * * * *